United States Patent [19]
McDermott et al.

[11] Patent Number: 5,568,067
[45] Date of Patent: Oct. 22, 1996

[54] CONFIGURABLE XNOR/XOR ELEMENT

[75] Inventors: Mark W. McDermott; John E. Turner, both of Austin, Tex.

[73] Assignee: Cyrix Corporation, Richardson, Tex.

[21] Appl. No.: 497,007

[22] Filed: Jun. 30, 1995

[51] Int. Cl.$^6$ .......................... H03K 19/094; H03K 19/21
[52] U.S. Cl. .................. 326/55; 326/45; 326/54
[58] Field of Search ................ 326/52–55, 45, 326/50, 121, 122

[56] References Cited

U.S. PATENT DOCUMENTS

| | | | |
|---|---|---|---|
| 3,439,185 | 4/1969 | Gibson | 326/121 |
| 4,006,365 | 2/1977 | Marzin et al. | 326/55 |
| 4,749,886 | 6/1988 | Hedayati | 326/54 |
| 4,968,903 | 11/1990 | Smith et al. | 326/50 |
| 5,140,594 | 8/1992 | Haulin | 326/121 |

*Primary Examiner*—Edward P. Westin
*Assistant Examiner*—Richard Roseen
*Attorney, Agent, or Firm*—Andrew S. Viger; John L. Maxin

[57] ABSTRACT

A configurable XNOR/XOR logic element is used, in an exemplary embodiment, in an array of spare gates included in a processor or other integrated circuit. The XNOR/XOR logic element (FIG. 4, 60) is configurable as either an XNOR or an XOR gate by a C (configuration) input (that can be metal configurable as either asserted or deasserted). Inverted and noninverted C inputs control two coupling circuits: (a) coupling circuit C10 includes p-transistors C11, C12, C13, and C14, and (b) coupling circuit C20 includes n-transistors C21, C22, C23, and C24. Depending on whether the C input is deasserted or asserted (and the inverted C input is correspondingly asserted or deasserted), these configuration transistors series or cross couple parallel stacked p- and n-transistors that receive inverted and noninverted A and B inputs to effect the selected configuration. Specifically, deasserting C provides the XOR configuration, while asserting C provides the XNOR configuration. In an alternative embodiment, the XNOR/XOR logic element can be used in a full adder to provide the sum output.

8 Claims, 4 Drawing Sheets

CONFIGURABLE XNOR/XOR ELEMENT

CROSS REFERENCE TO RELATED APPLICATIONS

This is related to a commonly assigned co-pending U.S. patent application Ser. No. 08/497,491, titled "Configurable NAND/NOR Element", filed Jun. 30, 1995.

BACKGROUND

1. Technical Field

The invention relates generally to digital circuits, and more particularly relates to programmable/configurable logic arrays. In even greater particularity, the invention relates to NAND and NOR gates.

In an exemplary embodiment, the invention is used in spare gate arrays of a processor to enable logic elements to be formed through metal interconnection only (i.e., without affecting transistor fabrication).

2. Related Art

Logic elements commonly used in the design of digital circuits in general, and processors in particular, include NAND, NOR, XNOR, XOR, and Inverter gates. In CMOS designs, these logic gates are fabricated from p- and n-channel transistors interconnected with metal lines.

Without limiting the scope of the invention, this background information is provided in the context of a specific problem to which the invention has application: in a processor design, maximizing the flexibility of using spare gates for correcting design errors through changes in the interconnection of logic elements.

Processors are fabricated from silicon wafers in a series of process steps that can be separated into (a) a base set of process steps that form transistors in the silicon substrate, and (b) a number of metal layers or levels (typically 2–4) that form metal interconnect lines. Approximately 75% of the total fabrication time is devoted to the base set.

Complex integrated circuits such as processors commonly include arrays of spare gates (NAND, NOR, Inverter, etc.) that can be used in fixing function and timing errors using only metal interconnections to and among a selected number of spare gates. Using this debugging approach, the base set transistors do not change—only the metal layers (of course, some functional errors can only be corrected by also changing the base set transistors).

For example, a number of wafers can be started and held after base set fabrication is complete, with only a few risk wafers being fabricated to completion. Parts assembled from the risk wafers can then be tested and, if possible, fixes for functional and timing errors can be identified that involve only the use of spare gates interconnected to the affected logic circuits. Once these fixes are identified, one or more new metal masks can be made, and used in completing fabrication of the wafers held at the metal stage of the process.

To facilitate the spare gate approach to debugging processors or other complex integrated circuits, it would be advantageous to maximize the flexibility of the design of spare gate arrays.

SUMMARY

An object of the invention is an improved design for logic elements used in fabricating logic gates. A more specific object of the invention is to maximize flexibility in the design of spare gate arrays, such as for use in making fixes to integrated circuits through metal interconnection of spare gates only.

This and other objects of the invention is achieved by a configurable XNOR/XOR logic element which receives A and B inputs and provides a Y output. The XNOR/XOR logic element is configurable as either an XNOR or an XOR gate by a C (configuration) input.

In one aspect of the invention, the XNOR/XOR logic element includes (a) first and second p-channel parallel transistors selectively intercoupled by a first coupling circuit, and (b) third and fourth n-channel parallel transistors selectively intercoupled by a second coupling circuit. The first parallel transistors are formed by a/B-input p-transistor in parallel with a B-input p-transistor. The second parallel transistors are formed by an A-input p-transistor in parallel with a /A-input p-transistor. The third parallel transistors are formed by an A-input n-transistor in parallel with a /A-input n-transistor. The fourth parallel transistors are formed by a B-input n-transistor in parallel with a /B-input n-transistor.

The A-input p-transistor of the second parallel transistors is coupled in series to the A-input n-transistor of the third parallel transistors to define a first output node, and the /A-input p-transistor of the second parallel transistors is coupled in series to the /A-input n-transistor of the third parallel transistors to define a second output node. The first and second output nodes are coupled to provide the Y output;

The XNOR/XOR logic element is configured by the first and second coupling circuits, which are responsive to a C (configuration) input. Based on the state of the C input, the first coupling circuits will either series or cross couple the first and second parallel transistors, and the second coupling circuit will either series or cross couple respectively the third and fourth parallel transistors.

Specifically, if the C input is asserted, then (a) the /B-input and B-input p-transistors of the first parallel transistors are respectively cross-coupled to the /A-input and A-input p-transistors of the second parallel transistors, and (b) the A-input and /A-input n-transistors of the third parallel transistors are respectively cross-coupled to the /B-input and B-input n-transistors of the fourth parallel transistors, thereby configuring the XNOR/XOR logic element as an XNOR gate with a corresponding Y output. Or, if the C input is deasserted, then (a) the /B-input and B-input p-transistors of the first parallel transistors are respectively series-coupled to the A-input and /A-input p-transistors of the second parallel transistors, and (b) the A-input and /A-input n-transistors of the third parallel transistors are respectively series-coupled to the B-input and /B-input n-transistors of the fourth parallel transistors, thereby configuring the XNOR/XOR logic element as an XOR gate with a corresponding Y output.

In other aspects of the invention, the first and second coupling circuits respectively comprise p- and n- transistors that receive either the C input or the complement of the C input. The first coupling circuit comprises (a) first and second C-input p-transistors respectively series-coupled between (i) the /B-input p-transistor of the first parallel transistors and the A-input of the second parallel transistors, and (ii) the B-input p-transistor of the first parallel transistors and the /A-input of the second parallel transistors, and (b) third and fourth /C-input p-transistors respectively cross-coupled between (i) the /B-input p-transistor of the first parallel transistors and the /A-input of the second parallel transistors, and (ii) the B-input p-transistor of the first parallel transistors and the A-input of the second parallel transistors. The second coupling circuit comprises (a) first and second /C-input n-transistors respectively series-coupled between (i) the A-input n-transistor of the third parallel transistors and the B-input of the fourth parallel transistors, and (ii) the /A-input n-transistor of the third parallel transistors and the /B-input of the fourth parallel transistors, and (b) third and fourth C-input n-transistors respectively cross-coupled between (i) the A-input n-transistor of the third parallel transistors and the /B-input of the fourth parallel transistors, and (ii) the /A-input n-transistor of the third parallel transistors and the B-input of the fourth parallel transistors.

In an exemplary embodiment, the XNOR/XOR logic element is used in an array of spare gates included in a processor or other integrated circuit. The XNOR/XOR logic element is metal configurable as either an XNOR gate or an XOR gate by configuring the C input as either deasserted or asserted (such as by tying the input to ground or to VDD).

In an alternative embodiment, the XNOR/XOR logic element can be used in a full adder to provide the sum output. In particular, the full adder can be formed by a combination of the XNOR/XOR logic element with a NAND/NOR logic element which provides the carry output.

Embodiments of the invention may be implemented to realize one or more of the following technical advantages. The NAND/NOR and XNOR/XOR logic elements are configurable respectively as NAND/NOR gates or as XNOR/XOR gates, such as by metal interconnection of the C (configuration) input. Such configurable logic elements can be used, as examples, to maximize flexibility in the design of spare gate arrays, such as for use in making fixes to integrated circuits through metal interconnection of spare gates only, or in programmable logic arrays. The NAND/NOR logic element uses one level of logic, while the XNOR/XOR logic element uses two levels of logic. One alternative embodiment of these logic elements is to form a full adder from a combination of one NAND/NOR and one XNOR/XOR logic element.

For a more complete understanding of the invention, and for further features and advantages, reference is now made to the Detailed Description of an exemplary embodiment of the invention, together with the accompanying Drawings, it being understood that the invention encompasses any modifications or alternative embodiments that fall within the scope of the claims.

DRAWINGS

FIGS. 1a and 1b respectively illustrate conventional CMOS NAND and NOR gates.

FIGS. 2a and 2b respectively illustrate conventional CMOS XNOR and XOR gates.

DETAILED DESCRIPTION

The detailed description of an exemplary embodiment of the configurable NAND/NOR and XNOR/XOR logic element is organized as follows:

1. Conventional Logic Elements
   1.1. NAND/NOR
   1.2. XNOR/XOR
2. NAND/NOR Logic Element
3. XNOR/XOR Logic Element
4. Full Adder
5. Conclusion This organizational outline, and the corresponding headings, are used in this Detailed Description for convenience of reference only.

The exemplary NAND/NOR and XNOR/XOR logic elements is used in an in spare gate arrays of a processor or other complex integrated circuit to enable logic elements to be formed through metal interconnection only (i.e., without affecting the base set transistor fabrication).

Detailed descriptions of conventional or known aspects of logic element design are omitted so as to not obscure the description of the invention.

In the context of this Detailed Description of the exemplary embodiment, p- and n-transistors are respectively p-channel and n-channel CMOS transistors (p-channel transistors are active low).

When used with a signal, the # symbol designates a signal that is active low, while the / symbol designates the complement (inverse) of a signal.

1. Conventional Logic Elements

Conventional CMOS NAND, NOR, XNOR, and XOR gates are formed by interconnections of parallel and stacked (series) p- and n-channel transistors. NAND and NOR gates receive A and B inputs and provide a Y output—they require one level of logic. XNOR and XOR gates receive inverted and noninverted A and B inputs, and provide a Y output—because of input signal inversion, they require two levels of logic.

1.1. NAND/NOR

Figure 1A:
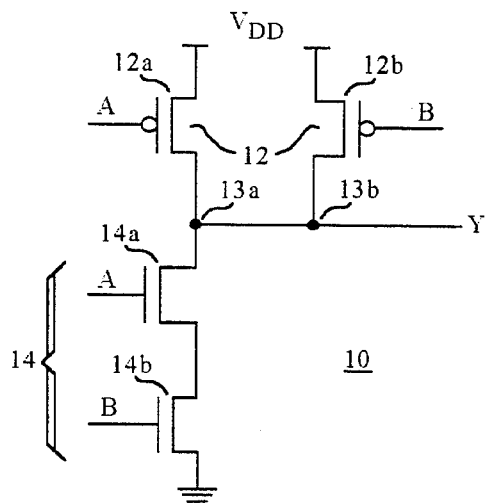
Figure 1B:
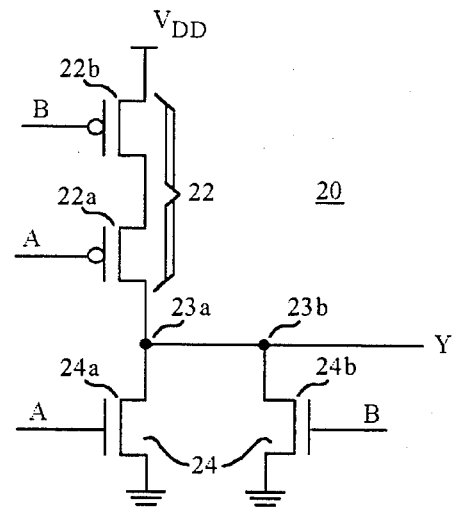

FIGS. 1a and 1b respectively illustrate conventional CMOS NAND and NOR gates.

Referring to FIG. 1a, a NAND gate 10 is formed by parallel p-transistors 12, and stacked (series) n-transistors 14. The parallel and stacked transistors are coupled together at output nodes 13a and 13b, which form the Y output of the NAND gate.

Parallel p-transistors 12a and 12b are coupled to VDD, and respectively receive the A and B inputs. Stacked n-transistors 14a and 14b respectively receive the A and B inputs.

The truth table for the NAND gate is:

| A | B | Y |
|---|---|---|
| 0 | 0 | 1 |
| 0 | 1 | 1 |
| 1 | 0 | 1 |
| 1 | 1 | 0 |

Referring to FIG. 1b, a NOR gate 20 is formed by stacked p-transistors 22, and parallel n-transistors 24. The stacked and parallel transistors are coupled together at output nodes 23a and 23b, which form the Y output of the NOR gate.

Stacked p-transistors 12a and 12b respectively receive the A and B inputs, with p-transistor 12b being coupled to VDD. Parallel n-transistors 14a and 14b respectively receive the A and B inputs.

The truth table for the NOR gate is:

| A | B | Y |
|---|---|---|
| 0 | 0 | 1 |
| 0 | 1 | 0 |
| 1 | 0 | 0 |
| 1 | 1 | 0 |

1.2. XNOR/XOR

Figure 2A:
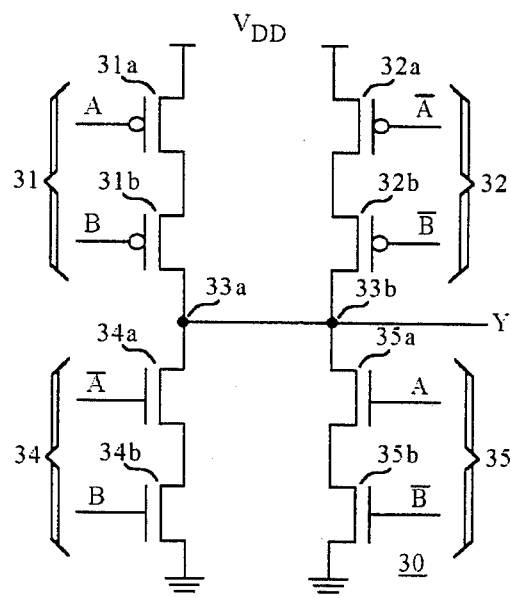
Figure 2B:
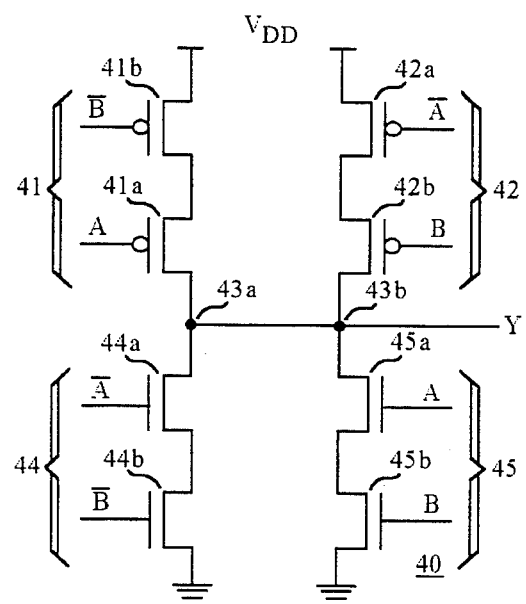

FIGS. 2a and 2b respectively illustrate conventional CMOS XNOR and XOR gates. Referring to FIG. 2a, an XNOR gate 30 is formed by parallel stacked p-transistors 31 and 32, and parallel stacked n-transistors 34 and 35. The parallel stacked p- and n-transistors are coupled together at output nodes 33a and 33b, which provide the Y output of the XNOR gate.

Stacked p-transistors 31a and 31b respectively receive noninverted A and noninverted B inputs, with p-transistor 31a being coupled to VDD. Stacked p-transistors 32a and 32b respectively receive inverted A and inverted B inputs, with p-transistor 32a being coupled to VDD.

Stacked n-transistors 34a and 34b respectively receive inverted A and noninverted B inputs. Stacked n-transistors 35a and 35b respectively receive noninverted A and inverted B inputs.

The truth table for the XNOR gate is:

| A | B | Y |
|---|---|---|
| 0 | 0 | 1 |
| 0 | 1 | 0 |
| 1 | 0 | 0 |
| 1 | 1 | 1 |

Referring to FIG. 2b, an XOR gate 40 is formed by parallel stacked p-transistors 41 and 42, and parallel stacked n-transistors 44 and 45. The parallel stacked p- and n-transistors are coupled together at output nodes 43a and 43b, which provide the Y output of the XOR gate.

Stacked p-transistors 31a and 31b respectively receive noninverted A and inverted B inputs, with p-transistor 31b being coupled to VDD. Stacked p-transistors 32a and 32b respectively receive inverted A and noninverted B inputs, with p-transistor 32a being coupled to VDD.

Stacked n-transistors 34a and 34b respectively receive inverted A and inverted B inputs. Stacked n-transistors 35a and 35b respectively receive noninverted A and noninverted B inputs.

The truth table for the XOR gate is:

| A | B | Y |
|---|---|---|
| 0 | 0 | 0 |
| 0 | 1 | 1 |
| 1 | 0 | 1 |
| 1 | 1 | 0 |

2. NAND/NOR Logic Element

Figure 3:
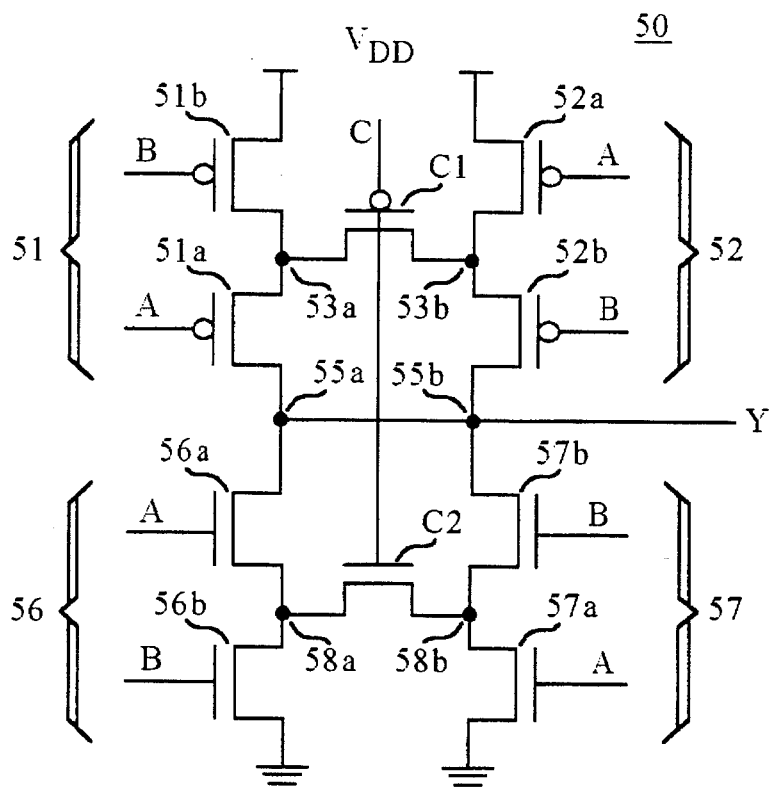
FIG. 3 illustrates a configurable NAND/NOR logic element in accordance with one aspect of the invention.

FIG. 3 illustrates a configurable NAND/NOR logic element 50 in accordance with one aspect of the invention. The configurable NAND/NOR logic element receives A and B inputs and provides a Y output The NAND/NOR logic element is configurable as either a NAND or a NOR gate by a C (configuration) input. The C input controls two configuration transistors: p-transistor C1 and n-transistor C2. Depending on whether the C input is deasserted or asserted, these configuration transistors short corresponding internal nodes to effect the selected configuration.

The NAND/NOR logic element 50 includes parallel stacked p-transistors 51 and 52, and parallel stacked n-transistors 56 and 57. The parallel stacked p- and n-transistors are coupled together at output nodes 55a and 55b, which provide the Y output of the logic element.

The parallel stacked transistors 51 and 52 respectively define internal nodes 53a/53b. The parallel stacked transistors 56 and 57 respectively define internal nodes 58a/58b.

The configuration p-transistor C1 is coupled between the internal nodes 53a/53b, and the configuration n-transistor C2 is coupled between the internal nodes 58a/58b.

If the C input is deasserted, the configuration p-transistor C1 turns on and shorts the internal nodes 53a/53b. As a result, the NAND/NOR logic element 50 is configured as a NAND gate with a corresponding Y output.

If the C input is asserted, the configuration n-transistor C2 turns on and shorts the internal nodes 58a/58b. As a result, the NAND/NOR logic element 50 is configured as a NOR gate with a corresponding Y output.

The truth table for the NAND/NOR logic element is:

| C | A | B | Y |
|---|---|---|---|
| 0 | 0 | 0 | 1 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

As indicated above, C deasserted [0] provides the NAND configuration, while C asserted [1] provides the NOR configuration°

In an exemplary embodiment, the NAND/NOR logic element is used in an array of spare gates included in a processor or other integrated circuit. Each NAND/NOR logic element is metal configurable as either a NAND gate or a NOR gate by configuring the C input metal line to be either deasserted or asserted (such as by tying the C input to ground or to VDD).

3. XNOR/XOR Logic Element

Figure 4:
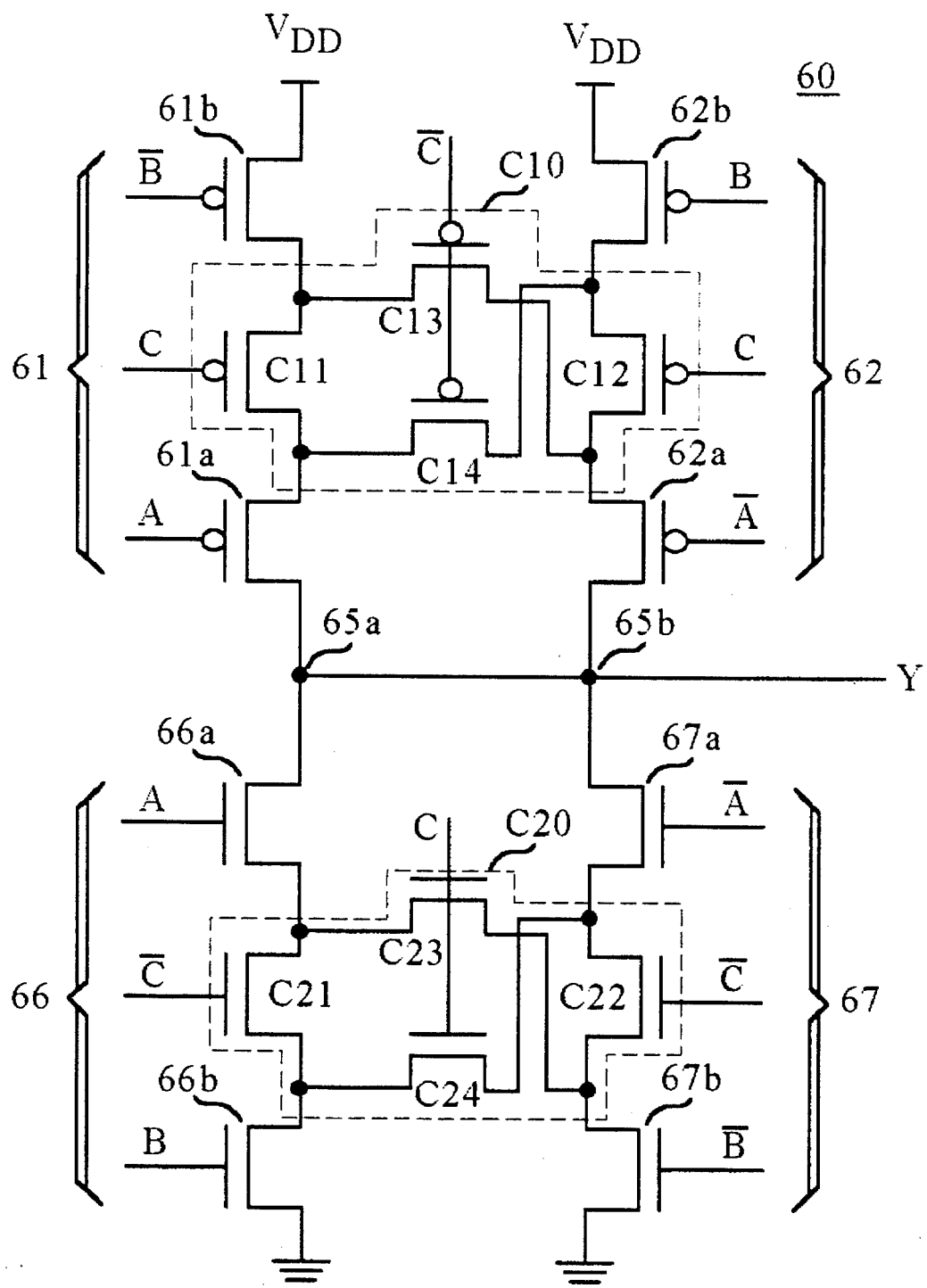
FIG. 4 illustrates a configurable XNOR/XOR logic element in accordance with one aspect of the invention.

FIG. 4 illustrates a configurable XNOR/XOR logic element 60 in accordance with one aspect of the invention. The configurable XNOR/XOR logic element which receives A and B inverted and noninverted inputs and provides a Y output.

The XNOR/XOR logic element 60 is configurable as either an XNOR or an XOR gate by a C (configuration) input. Inverted and noninverted C inputs control two coupling circuits: (a) coupling circuit C10 which includes p-transistors C11, C12, C13, and C14, and (b) coupling circuit C20 which includes n-transistors C21, C22, C23, and C24. Depending on whether the C input is deasserted or asserted (and the /C input is correspondingly asserted or deasserted), these configuration transistors series or cross couple parallel stacked p- and n-transistors to effect the selected configuration.

The XNOR/XOR logic element 60 includes (a) parallel stacked p-transistors 61 and 62, intercoupled by coupling circuit C10, and (b) parallel stacked n-transistors 66 and 67, intercoupled by coupling circuit C20. The parallel stacked p- and n-transistors are coupled together at output nodes 65a/65b, which provide the Y output of the logic element.

The parallel p-transistors 61b and 62b respectively receive inverted B and noninverted B inputs, while the parallel p-transistors 61a and 62a respectively receive noninverted and inverted A inputs. The parallel n-transistors 66a and 67a respectively receive noninverted and inverted A inputs, while the parallel n-transistors 66b and 67b respectively receive noninverted and inverted B inputs.

To configure the XNOR/XOR logic element, the inverted and noninverted configuration C inputs are used to selectively configure the coupling circuits C10 and C20. Specifically, based on the state of the C and /C inputs, (a) the coupling circuit C10 will either series or cross couple the /B and B input p-transistors 61a and 62a respectively to the A and /A input p-transistors 61a and 62a, and (b) the coupling circuit C20 will either series or cross couple the B and /B input n-transistors 66b and 67b respectively to the A and /A input n-transistors 66a and 66b. In effect, this configuration operation using the C and /C configuration inputs configures the XNOR/XOR logic element as either an XNOR or an XOR gate as illustrated respectively in FIGS. 2a and 2b.

Specifically, if the C input is asserted (/C deasserted), then (a) the /B and B input p-transistors 61b and 62b are respectively cross-coupled to the /A and A input p-transistors 62a and 61a, and (b) the A and /A input n-transistors 66a and 67a are respectively cross-coupled to the /B and B-input n-transistors 67b and 66b, thereby configuring the XNOR/XOR logic element as an XNOR gate with a corresponding Y output. Or, if the C input is deasserted (/C asserted), then (a) the /B and B input p-transistors 61b and 62b are respectively series-coupled to the A and /A input p-transistors 61a and 62a, and (b) the A and /A input n-transistors 66a and 67a are respectively series-coupled to the B and /B input n-transistors 66b and 67b, thereby configuring the XNOR/XOR logic element as an XOR gate with a corresponding Y output.

The truth table for the XNOR/XOR logic element is:

| C | A | B | Y |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

As indicated above, C deasserted [0] provides the XOR configuration, while C asserted [1] provides the XNOR configuration.

In an exemplary embodiment, the XNOR/XOR logic element is used in an array of spare gates included in a processor or other integrated circuit. Each XNOR/XOR logic element is metal configurable as either an XNOR gate or an XOR gate by configuring the C input metal line to be either deasserted or asserted (such as by tying the C input to ground or to VDD).

4. Full Adder

In an alternative embodiment, the NAND/NOR and XNOR/XOR logic elements may be combined to implement a full adder.

Figure 5:
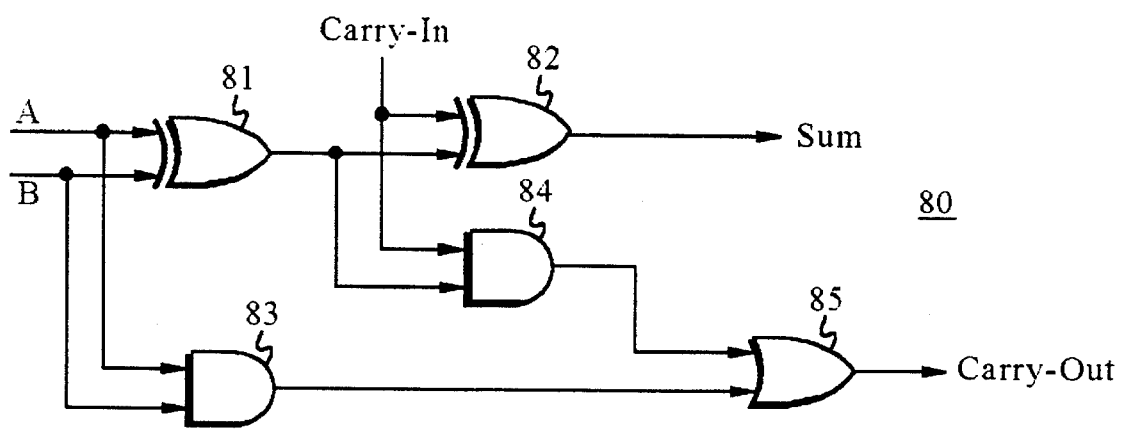
FIG. 5 illustrates a conventional full adder design.

FIG. 5 illustrates a conventional full adder design. The full adder 80 includes XOR gates 81 and 82, AND gates 83 and 84, and OR gate 85. The XOR 81 and AND 83 receive the A and B inputs, while the XOR 82 and AND 84 receive the Carry-in. The XOR 82 provides the Sum output, and the OR 85 provides the Carry-out.

Note that the truth table for the NAND/NOR logic element (Section 2) is the truth table for the Complement Carry-out of a full adder (Carry-out is available by inverting the inputs to the logic element). Note also that the truth table for the XNOR/XOR logic element (Section 3) is also the truth table for the Sum output of a full adder.

Figure 6:
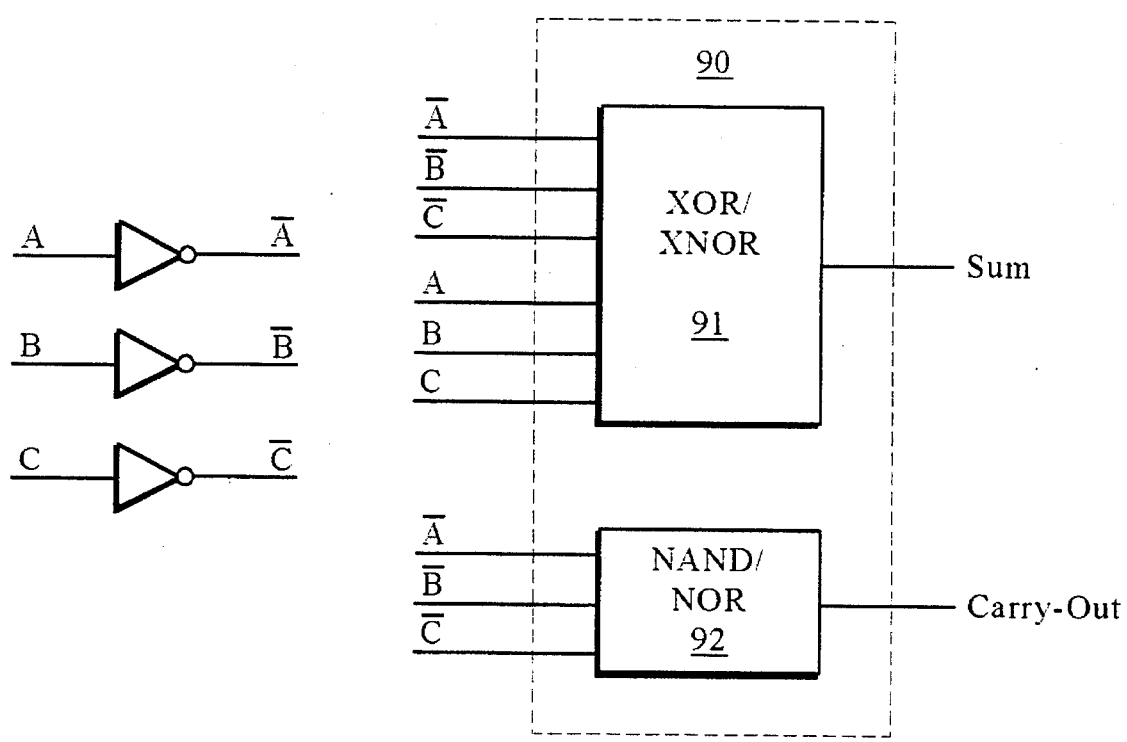
FIG. 6 illustrates a full adder formed by a combination of one NAND/NOR logic element and one XNOR/XOR logic element in accordance with an alternative embodiment of the invention.

FIG. 6 illustrates a full adder 90 formed by a combination of one NAND/NOR logic element 91 and one XNOR/XOR logic element 92. The full adder receives inverted and noninverted A and B inputs, along with the carry-in C from the next LSB adder. The XNOR/XOR logic element 91 provides the Sum output, while the NAND/NOR logic element 92 (which receives inverted A, B, and C inputs) provides the Carry-out.

5. Conclusion

Although the Detailed Description of the invention has been directed to certain exemplary embodiments, various modifications of these embodiments, as well as alternative embodiments, will be suggested to those skilled in the art.

The invention encompasses any modifications or alternative embodiments that fall within the scope of the Claims.

We claim:

1. A configurable XNOR/XOR logic element receiving A and B inputs and providing a Y output, comprising:

(a) first parallel transistors including a /B-input p-transistor in parallel with a B-input p-transistor; and (b) second parallel transistors including an A-input p-transistor in parallel with a /A-input p-transistor;

(c) the first and second parallel transistors being selectively intercoupled by a first coupling circuit;

(d) third parallel transistors including an A-input n-transistor in parallel with a /A-input n-transistor; and (e) fourth parallel transistors including an B-input n-transistor in parallel with a /B-input n-transistor;

(f) the third and fourth parallel transistors being selectively intercoupled by a second coupling circuit;

(g) the A-input p-transistor of the second parallel transistors being coupled in series to the A-input n-transistor of the third parallel transistors to define a first output node, and the /A-input p-transistor of the second parallel transistors being coupled in series to the /A-input n-transistor of the third parallel transistors to define a second output node, the first and second output nodes being coupled to provide the Y output;

(h) the first and second coupling circuits being controlled by a C input such that;

(i) if the C input is asserted, then (a) the /B-input and B-input p-transistors of the first parallel transistors are respectively cross-coupled to the /A-input and A-input p-transistors of the second parallel transistors, and (b) the A-input and /A-input n-transistors of the third parallel transistors are respectively cross-coupled to the /B-input and B-input n-transistors of the fourth parallel transistors, thereby configuring the XNOR/XOR logic element as an XNOR gate with a corresponding Y output; or (j) if the C input is deasserted, then (a) the /B-input and B-input p-transistors of the first parallel transistors are respectively series-coupled to the A-input and /A-input p-transistors of the second parallel transistors, and (b) the A-input and /A-input n-transistors of the third parallel transistors are respectively series-coupled to the B-input and /B-input n-transistors of the fourth parallel transistors, thereby configuring the XNOR/XOR logic element as an XOR gate with a corresponding Y output.

2. The XNOR/XOR logic element of claim 1, wherein the first coupling circuit comprises:

(a) first and second C-input p-transistors respectively series-coupled between (i) the /B-input p-transistor of the first parallel transistors and the A-input of the second parallel transistors, and (ii) the B-input p-transistor of the first parallel transistors and the /A-input of the second parallel transistors; and (b) third and fourth /C-input p-transistors respectively cross-coupled between (i) the /B-input p-transistor of the first parallel transistors and the /A-input of the second parallel transistors, and (ii) the B-input p-transistor of the first parallel transistors and the A-input of the second parallel transistors.

3. The XNOR/XOR logic element of claim 1, wherein the second coupling circuit comprises:

(a) first and second /C-input n-transistors respectively series-coupled between (i) the A-input n-transistor of the third parallel transistors and the B-input of the fourth parallel transistors, and (ii) the /A-input n-transistor of the third parallel transistors and the /B-input of the fourth parallel transistors; and (b) third and fourth C-input n-transistors respectively cross-coupled between (i) the A-input n-transistor of the third parallel transistors and the /B-input of the fourth parallel transistors, and (ii) the /A-input n-transistor of the third parallel transistors and the B-input of the fourth parallel transistors.

4. The XNOR/XOR logic element of claim 1, wherein:

(a) the A and B inputs to the logic element are the A and B inputs to a full adder, and the C input is the carry-in to the full adder; and (b) the Y output is the complement of the sum output of the full adder.

5. In an array of spare gates incorporated into an integrated circuit, a plurality of configurable XNOR/XOR logic elements each receiving A and B inputs and providing a Y output, each XNOR/XOR logic element comprising:

(a) first parallel transistors including a /B-input p-transistor in parallel with a B-input p transistor; and (b) second parallel transistors including an A-input p-transistor in parallel with a /A-input p transistor;

(c) the first and second parallel transistors being selectively intercoupled by a first coupling circuit;

(d) third parallel transistors including an A-input n-transistor in parallel with a /A-input n-transistor; and (e) fourth parallel transistors including an B-input n-transistor in parallel with a /B-input n-transistor;

(f) the third and fourth parallel transistors being selectively intercoupled by a second coupling circuit;

(g) the A-input p-transistor of the second parallel transistors being coupled in series to the A-input n-transistor of the third parallel transistors to define a first output node, and the /A-input p-transistor of the second parallel transistors being coupled in series to the /A-input n-transistor of the third parallel transistors to define a second output node, the first and second output nodes being coupled to provide the Y output;

(h) the first and second coupling circuits being controlled by a C input such that;

(i) if the C input is asserted, then (a) the /B-input and B-input p-transistors of the first parallel transistors are respectively cross-coupled to the /A-input and A-input p-transistors of the second parallel transistors, and (b) the A-input and /A-input n-transistors of the third parallel transistors are respectively cross-coupled to the /B-input and B-input n-transistors of the fourth parallel transistors, thereby configuring the XNOR/XOR logic element as an XNOR gate with a corresponding Y output; or (j) if the C input is deasserted, then (a) the /B-input and B-input p-transistors of the first parallel transistors are respectively series-coupled to the A-input and /A-input p-transistors of the second parallel transistors, and (b) the A-input and /A-input n-transistors of the third parallel transistors are respectively series-coupled to the B-input and /B-input n-transistors of the fourth parallel transistors, thereby configuring the XNOR/XOR logic element as an XOR gate with a corresponding Y output.

6. The XNOR/XOR logic element of claim 5, wherein the first coupling circuit comprises:

(a) first and second C-input p-transistors respectively series-coupled between (i) the /B-input p-transistor of the first parallel transistors and the A-input of the second parallel transistors, and (ii) the B-input p-transistor of the first parallel transistors and the /A-input of the second parallel transistors; and (b) third and fourth /C-input p-transistors respectively cross-coupled between (i) the /B-input p-transistor of the first parallel transistors and the /A-input of the second parallel transistors, and (ii) the B-input p-transistor of the first parallel transistors and the A-input of the second parallel transistors.

7. The XNOR/XOR logic element of claim 5, wherein the second coupling circuit comprises:

(a) first and second /C-input n-transistors respectively series-coupled between (i) the A-input n-transistor of the third parallel transistors and the B-input of the fourth parallel transistors, and (ii) the /A-input n-transistor of the third parallel transistors and the /B-input of the fourth parallel transistors; and (b) third and fourth C-input n-transistors respectively cross-coupled between (i) the A-input n-transistor of the third parallel transistors and the /B-input of the fourth parallel transistors, and (ii) the /A-input n-transistor of the third parallel transistors and the B-input of the fourth parallel transistors.

8. The XNOR/XOR logic element of claim 1, wherein the state of the C input as asserted or deasserted is determined at the time of fabrication.

\* \* \* \* \*